United States Patent [19]
Woods et al.

[11] Patent Number: 5,187,048

[45] Date of Patent: Feb. 16, 1993

[54] PHOTORESISTS FORMED BY POLYMERIZATION OF DI-UNSATURATED MONOMERS

[75] Inventors: John Woods, County Dublin; John Guthrie, County Kildare; Pauline Coakley, County Kilkenny, all of Ireland

[73] Assignee: Loctite (Ireland) Limited, Dublin, Ireland

[21] Appl. No.: 751,414

[22] Filed: Aug. 28, 1991

[30] Foreign Application Priority Data

Jun. 23, 1989 [IE] Ireland .................. 2044/89

[51] Int. Cl.$^5$ .................. G03C 5/00
[52] U.S. Cl. .................. 430/286; 430/270; 430/281
[58] Field of Search .................. 430/286, 270, 281

[56] References Cited

U.S. PATENT DOCUMENTS

| | | | |
|---|---|---|---|
| 3,316,277 | 4/1967 | Gerber | 526/90 |
| 3,554,990 | 1/1971 | Quinn et al. | 428/522 |
| 4,081,276 | 3/1978 | Crivello et al. | |
| 4,348,473 | 9/1982 | Okumura et al. | 430/296 |
| 4,425,471 | 1/1984 | Millet | 526/298 |
| 4,539,250 | 9/1985 | Fujii et al. | 428/195 |
| 4,675,270 | 6/1987 | Woods et al. | 430/325 |
| 4,743,528 | 5/1988 | Farid et al. | 430/286 |

FOREIGN PATENT DOCUMENTS

| | | |
|---|---|---|
| 48899A2 | 4/1982 | European Pat. Off. . |
| 84108095.5 | 4/1985 | European Pat. Off. . |
| 58-108213 | 6/1983 | Japan . |
| 58-123727 | 7/1983 | Japan . |
| WO85/02030 | 5/1985 | PCT Int'l Appl. . |

OTHER PUBLICATIONS

8164 Instrument and Equipment Techniques, vol. 23 (1980) Nov.-Dec., by Gusakov, et al., "Apparatus for Depositing Organic Films from the Vapor State in Response to UV Light".

*Primary Examiner*—Marion E. McCamish
*Assistant Examiner*—Mark A. Chapman
*Attorney, Agent, or Firm*—Edward K. Welch, II; Eugene F. Miller

[57] ABSTRACT

A photoresist coating for use in microlithography comprises a polymer of a monomer of the formula

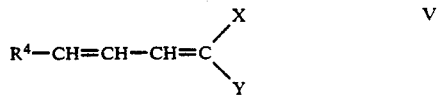

wherein X and Y are strong electron withdrawing groups and $R^4$ is H or, providing that X and Y are both —CN, $R^4$ may be aliphatic hydrocarbyl, aryl or alkaryl. Preferred monomers are of the formula

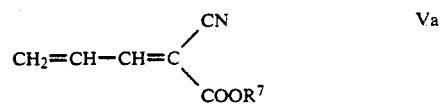

wherein $R^7$ is a $C_1$–$C_5$ alkyl or $C_2$–$C_5$ alkenyl group, more particularly ethyl 2-cyanopenta-2,4-dienoate or allyl 2-cyanopenta-2,4-dienoate.

Methods for applying a resist coating by vapor deposition of these monomers and exposure to radiation are described. A positive or negative tone image can be produced, depending upon the imaging method employed.

11 Claims, No Drawings

PHOTORESISTS FORMED BY POLYMERIZATION OF DI-UNSATURATED MONOMERS

BACKGROUND OF THE INVENTION

1. Field of the Invention

This invention relates to photoresists formed by polymerization of certain substituted butadiene monomers. The invention is especially useful in microlithography, particularly for producing semiconductor devices on silicon chips.

2. Description of the Related Art

The use of anionically or zwitterionically polymerisable monomers as resist materials for microlithography is known in the art, as discussed in U.S. Pat. No. 4,675,273 Woods et al and U.S. Pat. No. 4,675,270 Woods et al both assigned to Loctite (Ireland) Limited, the contents of which are incorporated herein by reference. Previous methods involved spin coating a solution of a cyanoacrylate polymer onto a substrate. U.S. Pat. No. 4,675,273 describes a method for applying a polymeric resist coating to an etchable substrate which comprises exposing the substrate to be coated to the vapour of an anionically polymerizable monomer of the formula:

$$CH=CXY \qquad \text{I}$$

where X and Y are strong electron withdrawing groups and R is H or, provided that X and Y are both —CN, R may be $C_1$-$C_4$ alkyl, for sufficient time to deposit a polymerizable coating thereon. Particularly preferred monomers are 2-cyanoacrylate esters. The coated substrate is subsequently imaged using high energy radiation; the image is developed by conventional solvent development processes; the image is etched using a suitable plasma or acid etching process; and the resist coating may be subsequently removed by heating the coating to a temperature above the polymer depolymerization temperature.

U.S. Pat. No. 4,675,270 describes an imaging method which comprises (a) providing a substrate having a surface reactive to activate polymerization of a monomer defined by the formula I as defined above; (b) treating the surface of the substrate with a photosensitive compound which releases an acid when exposed to actinic or ionizing radiation; (c) subsequently imagewise exposing the substrate to radiation of an energy effective to release said acid from said photosensitive compound; and then (d) exposing the substrate to vapours of one of said monomers for sufficient time to form a polymer coating over the substrate in the areas thereof not exposed to the radiation, forming a relief image.

Cyanoacrylate polymers generally form positively imaged resists i.e. the relief image is in areas which have not been exposed to radiation (see U.S. Pat. No. 4,279,984 Matsuda et al, assigned to Matsushita Electric Industrial Co. Ltd.). The process of U.S. Pat. No. 4,675,270 also forms a positively imaged resist.

It is also known to form negatively imaged resists i.e. the relief image is in areas which have been exposed to radiation. U.S. Pat. No. 4,551,418 Hult et al describes a process for generating a negative tone resist image comprising the steps of:

(1) coating a substrate with a film that contains a cationic photoinitiator; (2) exposing the film in an imagewise fashion to radiation and thereby generating cationic initiator in the exposed regions of the film; (3) treating the exposed film with a cationic-sensitive monomer to form a film of polymer resistant to plasma etching; and (4) developing the resist image by etching with a plasma.

It is an object of the present invention to generate negatively-imaged resists using anionic or zwitterionic polymerizable monomers. 1,1-disubstituted 1,3-butadienes are already known. U.S. Pat. No. 3,316,227 Gerber assigned to Lord Corporation describes 1,1-disubstituted diunsaturated compounds having a formula selected from the groups consisting of

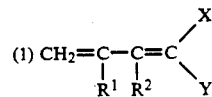

and

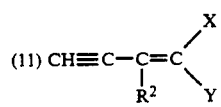

where $R^1$ is selected from the group consisting of hydrogen, alkyl groups containing from 1 to 5 carbon atoms, phenyl and halogen; where $R^2$ is selected from the group consisting of hydrogen and methyl, and where X and Y are dissimilar electron-withdrawing groups and are separately selected from the group consisting of cyano, carbethoxy, ethyl sulfone, phenyl sulfone, formyl, acetyl, benzoyl, diethyl, phosphonyl, amide and phenyl. These compounds are described as having utility in the fields of adhesives and coatings.

U.S. Pat. No. 3,554,990 Quinn et al assigned to Eastman Kodak Company describes esters of 2-cyanopenta-2,4-dienoic acid having the structural formula:

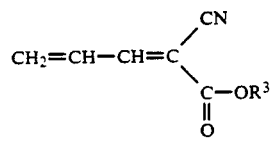

wherein $R^3$ is an alkenyl group of 2-10 carbon atoms or an alkoxy substituted alkyl group of 2-10 carbon atoms. These esters are said to be useful as adhesives for general and particularly for surgical uses.

There is no suggestion in the prior art that polymers of substituted 1,3-butadienes might find utility as photoresists.

SUMMARY OF THE INVENTION

The present inventors have now surprisingly found that certain substituted 1,3-butadienes have different and/or advantageous properties, as compared to cyanoacrylates, in making photoresists.

The present invention provides a polymeric resist coating comprising a polymer of a monomer of the formula

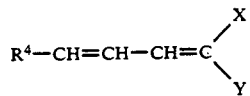

wherein X and Y are strong electron withdrawing groups and $R^4$ is H or, providing that X and Y are both —CN, $R^4$ may be hydrocarbyl, aryl or alkaryl. The term "hydrocarbyl" as used herein means "aliphatic hydrocarbyl" including alkyl, alkenyl and alkynyl. The polymeric resist coating of the present invention has an advantage over a resist coating of a cyanoacrylate polymer in that the coating of the present invention has better thermal stability.

The polymeric resist coating may be formed by applying a solution of the polymer onto a substrate, for example by the known technique of spin coating. However it is preferred to use vapour deposition.

In one aspect therefore the invention provides a method for applying a polymeric resist coating to a substrate which comprises exposing the substrate to the vapour of a monomer of the formula V as defined above for sufficient time to deposit a polymerized coating of the monomer on the substrate.

In a second aspect the invention provides an imaging method comprising applying a polymeric resist coating as defined above to a substrate, imagewise exposing the coated substrate to high energy radiation, and developing the image by a solvent development process to form a negative tone image.

Although this invention is not limited by any theory, it is believed that because the polymer of a dienoate monomer contains unsaturation, the exposure to high energy radiation leads to further crosslinking which reduces the solubility of the exposed areas as compared to the unexposed areas. Consequently the unexposed areas are dissolved more readily in the solvent development process. In contrast, the polymer of a cyanoacrylate polymer is saturated and the effect of the radiation is to degrade the polymer in the exposed areas, with the result that these areas are more readily dissolved than the unexposed areas.

In a third aspect the present invention provides an imaging method comprising
(a) providing a substrate having a surface reactive to activate polymerization of a monomer of the formula V as defined above;
(b) treating the surface of the substrate with a photosensitive compound which releases an acid when exposed to actinic or ionizing radiation;
(c) subsequently imagewise exposing the substrate to radiation of an energy effective to release said acid from said photosensitive compound; and then
(d) exposing the substrate to vapours of one of said monomers of formula V for sufficient time to form a polymeric coating over the substrate in the areas thereof not exposed to the radiation.

By use of the imaging method of this third aspect of the invention, a positive tone image is produced. Thus the monomer of the formula V has the advantage over a cyanoacrylate monomer that it can be used to produce either a negative or a positive tone image, depending upon the imaging method employed.

A fourth aspect of the invention comprises an imaged article prepared by the foregoing inventive methods.

In the definition of the monomers of formula V, the term "strong electron withdrawing groups" refers to groups which are more electron withdrawing than halo. Generally the electron withdrawing groups X and Y may be independently selected from —$SO_2R^6$; —$SO_3R^6$; —CN; —$COOR^5$ and —$COR^6$ wherein $R^5$ represents a hydrocarbyl or substituted hydrocarbyl group such as a straight chain or branched chain $C_1$-$C_{12}$ alkyl group (which may be substituted with a substituent such as a halogen atom or an alkoxy group), a straight chain or branched chain $C_2$-$C_{12}$ alkenyl group, a straight chain or branched chain $C_2$-$C_{12}$ alkynyl group, a cycloalkyl group, an aralkyl group or an aryl group; and $R^6$ represents H or hydrocarbyl, preferably $C_1$-$C_{12}$ hydrocarbyl. Preferably at least one of X and Y is —CN.

Specific examples of the groups for $R^5$ are a methyl group, an ethyl group, an n-propyl group, an isopropyl group, an n-butyl group, an isobutyl group, a pentyl group, a hexyl group, an allyl group, a methallyl group, a crotyl group, a propargyl group, a cyclohexyl group, a benzyl group, a phenyl group, a cresyl group, a 2-chloroethyl group, a 3-chloropropyl group, a 2-chlorobutyl group, a trifluoroethyl group, a 2-methoxyethyl group, a 3-methoxybutyl group and a 2-ethoxyethyl group.

In the monomer of formula V, $R^4$ is preferably H but provided that X and Y are both —CN, $R^4$ may suitably be a $C_1$-$C_{20}$ hydrocarbyl group, more particularly a $C_1$-$C_{20}$ alkyl group.

The most preferred monomers of the formula V are those of the formula

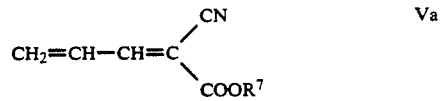

wherein $R^7$ is a $C_1$-$C_5$ alkyl or $C_2$-$C_5$ alkenyl group, more particularly ethyl 2-cyanopenta-2,4-dienoate or allyl 2-cyanopenta-2,4-dienoate.

In the case of deposition from solution, a polymer is prepared and then dissolved in a suitable solvent such as dichloromethane, acetone, nitromethane, tetrahydrofuran, acetonitrile, or chloroform. In the case of vapour deposition processes, the monomer vapours may be generated from the monomers at ambient temperatures and pressures but it is generally preferred to heat the monomers and/or reduce the atmospheric pressure above the monomer generated in the chamber in order to generate sufficient concentrations of vapour to accomplish the polymer deposition on the substrate in a reasonable time.

Virtually any substrate upon which a polymeric image is desired may be utilized in the inventive processes. Most advantageously, the substrates will be ones which undergo subsequent acid or plasma etching during which the polymer coating serves as an etch resist. Suitable substrate materials include silicon dioxide, including $SiO_2$ coated silicon, metallic oxides, and glass, all of which may be etched by plasma or acid etching processes. Metallic substrates which can be etched by acid processes, such as copper coated epoxy/glass boards used in printed circuit board manufacture and metal printing plates may also be utilized in the inventive process. Where the inventive process is used to produce an etch resist, the resist coating may be removed after etching by treatment with dilute caustic solution (e.g. NaOH) or by exposure to a suitable plasma (e.g. oxygen plasma).

The preferred substrate is $SiO_2$ coated silicon, e.g. the silicon chips conventionally used in preparation of semiconductor devices. Most suitably, this substrate is etched by plasma etching process.

In the case of vapour deposition processes, no surface treatment will be necessary if the substrate surface is inherently active for inducing anionic or zwitterionic polymerization of the monomer. In certain cases, however, where the substrate is slightly acidic or neutral it is necessary to activate the surface with a basic liquid or vapour which is substantially removed before exposing the substrate to the monomer vapour. Suitable activators include the known initiators for anionic or zwitterionic polymerization of alkyl cyanoacrylates. Especially suitable activators are organic amines and phosphines.

In the imaging method of the second aspect of the invention, a conventional solvent development process may be used to develop the image, e.g. immersion in ethyl acetate, isobutyl methyl ketone, acetone or blends of ethyl acetate with either of isobutyl methyl ketone and acetone. Compounds which release acid upon irradiation for the process of the third aspect of the invention include any compounds which release Lewis or protonic acids such as those known as photoinitiators for cationically polymerizable resins such as epoxies or vinyl ethers. Additionally included are compounds which release sulfonic acids upon irradiation and are known as photolytically releasable latent thermal catalysts for acid curable stoving lacquers.

Suitable radiation sensitive acid precursors useful in the inventive method include salts of complex halogenides represented by the formula $$[A]_d{}^+[MX_e]^{-(e-f)}$$

wherein A is a cation selected from iodonium, iodosyl, Group VIa onium, pyrylium, thiopyrylium, sulfonylsulfoxonium, and diazonium, M is a metal or metalloid, X is a halogen radical, d=e-f, f=the valence of M and is an integer equal to from 2 to 7 inclusive and e is greater than f and is an integer having a value up to 8; compounds of the formula $$R^8[O.SO_2-CQ_3]_n$$

wherein $R^8$ is an organic radical of valency 1 to 4 and Q is hydrogen or fluorine and n is an integer from 1 to 4; and compounds which release sulfonic acids when irradiated such as those disclosed in U.S. Pat. Nos. 4,504,372 and 4,510,290, both incorporated herein by reference.

The acid generating compound may be applied neat or in a solvent which is subsequently evaporated. If a surface activator is also to be applied to the substrate, both the activator and the acid generating compound may be applied simultaneously in a common solvent. Alternatively, the activator may be applied before or after application of the acid generating compound.

Only trace amounts of surface activator and acid generating compound are necessary. Mirror finish substrates may be repolished, e.g. with a suitable tissue, after application of these compounds and still retain sufficient activator and acid generator to give sharply imaged resists after irradiation and exposure to monomer vapour.

DESCRIPTION OF THE PREFERRED EMBODIMENTS

The invention is further illustrated by the following non-limiting examples.

EXAMPLE 1

Acrolein (50 g, 0.89 moles) was added dropwise over 15 minutes to a stirred solution of ethyl cyanoacetate (65 g, 0.58 moles) in tetrahydrofuran (THF, 200 mls) containing zinc chloride (50 g). After stirring for 19 hours at room temperature, the clear yellow solution was diluted with petroleum spirit b.p. 40°-60° C. (200 mls) and the mixture washed with dilute hydrochloric acid (0.1 m, 4×100 ml. portions) and then water (3×100 ml portions). The petroleum extract was dried ($Na_2SO_4$), filtered and the solvent removed under reduced pressure to yield an oil (66.6 g, 76%) which solidified to a waxy material after several hours. Spectral analysis of the product showed it to be consistent with the structure of ethyl 2-cyanopenta-2,4,-dienoate:

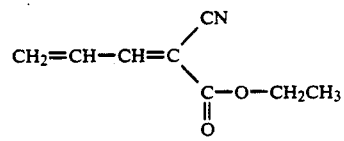

I.R. (K Br Disc); 2,220 cm$^{-1}$, —CH group; 1,730 cm$^{-1}$, —C≡O group; 1,620 cm$^{-1}$, $H_2C$═C— group; 1,580 cm$^{-1}$, —CH═C— group.

n.m.r. (CDCl$_3$); 2.1, d, 1H, (—CH═C(CN)COOR); 3.0 m, 1H, (═CH—C); 3.9, m, 2H, ($CH_2$═C<); 5.6, q, 2H, (O—$CH_2$—); 8.6, t, 3H, (—$CH_3$).

EXAMPLE 2

A polished silicon wafer, 3 inches (7.5 cm) in diameter, was activated by pouring a sufficient quantity of a solution of 10% N,N,N,N,-tetramethylethylene-diamine (TMED) in 1,1,1,3,3,3,hexamethyldisilazane (HMDS) to cover the surface. The wafer was then spun at 4,000 rpm for 30 seconds to restore the mirror finish and mounted in the top of a closed cylindrical chamber 11 cm in diameter consisting of an aluminium base and plastic sides 2 cm in height into which 2.0 grams of ethyl 2-cyano-penta-2,4-dienoate (Example 1) had been placed. The chamber was mounted on a thermostatically controlled hot plate and preheated to 50° C. prior to the introduction of the activated wafer. The wafer was mounted with the treated side 2 cms directly above the heated monomer liquid and exposed to its vapours for 10 minutes. During this period, a thin polymer film was formed on the exposed wafer surface.

The coated wafer was then imagewise exposed to ultraviolet light from a medium pressure mercury arc lamp (operating at 80 W per cm.) through a 4 inch (10 cm) square chrom plated quartz test mask which had alternate opaque and transmissive elements of varying sizes over the range 1000-1 micrometers patterned on the surface. To ensure adequate contact between the mask and coated wafer a copper plate 4 inches (10 cm) square and 5/8 inches (1.6 cm) in thickness with a 2 inch (5 cm) square centralized hole, was placed on the perimeter of the mask. The weight of the plate was 1 kilogram. After 5 minutes exposure, at a distance of 20 cms. directly below the arc lamp, the wafer was removed and immersed in a bath of ethyl acetate for 60 seconds during which time a negative tone image of the mask had developed. The imaged wafer was rinsed in petroleum ether b.p. 40°-60° C. for 30 seconds and examined microscopically. The minimum feature size measured using a Filer eyepiece was found to be 2.5 micrometers.

EXAMPLE 3

Allyl 2-cyanopenta-2,4-dienoate was prepared by the method described in Example 1 by replacing ethyl cyanoacetate by an equivalent quantity of allyl cyanoacetate. The yield of product from this reaction was 80%. The structure of the product was confirmed by an infra-red spectrum.

EXAMPLE 4

Thin films of poly (allyl-2-cyanopenta-2,4-dienoate) were vapour deposited directly from the monomer (Example 3) at 40° C. onto preactivated 3 inch (7.5 cm) silicon wafers by the method described in Example 2. The amounts of polymeric material deposited for varying monomer exposure times were determined by weighing the wafers on a semi-micro balance before and after deposition. The results were

| | Exposure time to Monomer Vapour (Mins) | Coating Weight (Mgs) |
| --- | --- | --- |
| Ref A | 20 | 1.54 |
| B | 27 | 2.35 |
| C | 40 | 3.95 |
| D | 55 | 4.49 |

EXAMPLE 5

Resist coated wafer A (Example 4) was imagewise exposed to UV light as described in Example 2 for 3 minutes. After development with acetone (2 minutes) and rinsing with ethanol a negative tone image was observed with a resolution of 5 micrometer sized features.

EXAMPLE 6

A polished silicon wafer, 3 inches (7.5 cm) in diameter, was treated with 3 drops of photocationic catalyst UVE 1014 (a photocatalyst supplied by General Electric Company which is described as a 50% solution of a substituted triphenyl sulfonium hexafluoro-antimonate and which is known to produce strong acid on irradiation with UV light from a mercury arc lamp). The wafer was then polished with tissue paper to restore the mirror finish. 3 drops of amine TMED were then brushed uniformly across the surface of the wafer which was then polished with a paper tissue again to restore the mirror finish. The wafer was then imagewise exposed to UV light (Example 2) for 60 seconds through a 1 mm thick aluminium grip plate mask containing 3 mm diameter holes regularly spaced at approximately 2 mm intervals. After irradiation the wafer was placed in the vapour chamber described in Example 2 for 10 minutes. After this time, a thin polymer film had deposited on the unexposed regions of the wafer surface yielding an accurate positive tone image of the mask pattern.

EXAMPLE 7

A solution of photocatalyst UVE 1014 (0.3%), TMED (2%) in acetone was spin-coated onto a silicon wafer. The wafer was imagewise exposed to UV light through a test mask as described in Example 2 for 66 seconds. The wafer was then placed in the vapour deposition chamber (described in Example 2) containing allyl 2-cyanopenta-2,4-dienoate (Example 3) at 40° C. for 9.5 minutes. During this time, a positive tone image of the mask pattern was formed by selective polymer deposition on the unexposed regions of the silicon surface. While the pattern across exposed area of the wafer was not uniform, resolved features of 10 micrometers size were observed in some areas.

EXAMPLE 8

The experiment of Example 7 was repeated for 30 seconds UV irradiation and 9.5 minutes monomer exposure in the vapour chamber. In this case the best resolved feature sizes were 2.5 micrometers.

EXAMPLE 9

The experiment of Example 7 was repeated for 20 seconds irradiation and 12 minutes monomer exposure. An imaged pattern over the entire UV exposed area was obtained. Resolution was found to vary over the range 2.5–10.0 micrometers.

EXAMPLE 10

A solution of the polymer derived from the monomer described in Example 1 was prepared by dissolving the polymer (8 g) in dichloromethane (100 g). A 3-inch (7.5 cm) pre-weighed silicon wafer was spin coated with an excess of the polymer solution for 10 seconds at 4,000 R.P.M. Residual solvent was removed in a nitrogen stream. The weight of coating deposited was found to be 6.81 mg which corresponds to a film thickness of approximately 1.2 micrometers.

The resist coated wafer was then imagewise exposed to ultraviolet light (as described in Example 2) for three minutes, cooled and immersed in an ethyl acetate bath for 15 seconds. A negative tone image was formed during the solvent development and a subsequent microscopic examination revealed resolved feature sizes with 15 micrometer dimensions.

EXAMPLE 11

Comparative Example

A 1 cm$^2$ polished silicon test wafer was activated by the method outlined in Example 2 and mounted polished side exposed on a 3 inch (7.5 cm) support wafer by means of a small piece of two-sided adhesive tape. The bonded assembly was introduced into the vapour coating chamber containing ethyl 2-cyanopenta-2,4-dienoate (Example 1) at 50° C. again as described in Example 2. After 5 minutes vapour exposure, the polymer coated wafer was withdrawn from the chamber and carefully separated from the support wafer such that no adhesive residue remained on the reverse, uncoated side of the test wafer.

The procedure was repeated using allyl 2-cyano-penta-2,4-dienoate and the corresponding prior art vapour deposited monomers ethyl and allyl 2-cyanoacrylates.

The polymer coated wafers were placed side by side on a conventional ceramic coated laboratory hot plate which had been modified such that the surface temperature could be monitored by means of a calibrated thermocouple.

The coated wafers were heated at a rate of approximately 30° C. per minute and the phase changes which occurred were noted as a function of temperature. The results obtained were as follows:

| Polymer | Phase Change | Temperature °C. |
| --- | --- | --- |
| Ethyl 2-cyanoacrylate | Liquefaction | 184 |
| | Evaporation | 193 |

-continued

| Polymer | Phase Change | Temperature °C. |
| --- | --- | --- |
| Ethyl 2-cyanopenta-2,4-dienoate | Liquefaction | 276 |
|  | Evaporation | 300 |
| Allyl 2-cyanoacrylate | Liquefaction | 141 |
|  | Evaporation | 146 |
| Allyl 2-cyanopenta-2,4-dienoate | Liquefaction | Not observed |
|  | Evaporation | 235 |

This result demonstrates that vapour deposited polymer layers of the present invention have significantly improved thermal stability over the prior art materials. The difference in evaporation temperature for the ethyl esters is 107° C. and for the allyl esters 89° C.

We claim:

1. An imaging method comprising applying a polymeric resist coating comprising a polymer of a monomer of the formula V

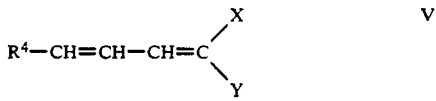

wherein X and Y are strong electron withdrawing groups and $R^4$ is H or, provided that X and Y are both —CN, $R^4$ may be hydrocarbyl, aryl or alkaryl, to a substrate, imagewise exposing the coated substrate to high energy radiation, and developing the image by a solvent development process to form a negative tone image.

2. An imaging method comprising:
   (a) providing a substrate having a surface reactive to activate polymerization of a monomer of the formula

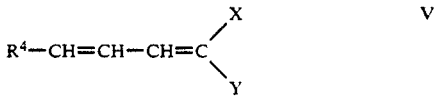

wherein X and Y are strong electron withdrawing groups and $R^4$ is H or, provided that X and Y are both —CN, $R^4$ may be hydrocarbyl, aryl or alkaryl;
   (b) treating the surface of the substrate with a photo-sensitive compound which releases an acid when exposed to actinic or ionizing radiation;
   (c) subsequently imagewise exposing the substrate to radiation of an energy effective to release said acid from said photosensitive compound; and then
   (d) exposing the substrate to vapours of one of said monomers of formula V for sufficient time to form a polymeric coating over the substrate in the areas thereof not exposed to the radiation.

3. In a method of coating a substrate with a polymeric resist coating in an image-wise fashion, said method comprising applying a polymerizable resist monomer to said substrate and polymerizing the same, the use of a monomer of the Formula I

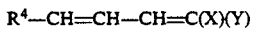

wherein X and Y are strong electron withdrawing groups and $R^4$ is H or, provided that X and Y are both —CN, $R^4$ may be hydrocarbyl, aryl or alkaryl, as the polymerizable resist monomer.

4. The method of claim 3 wherein X and Y are independently selected from —$SO_2R^6$; —$SO_3R^6$; —CN; —$COOR^5$ and —$COR^6$ wherein $R^5$ represents a hydrocarbyl or hydrocarbyl substituted with halogen or an alkoxy group, a cycloalkyl group, an arylkyl group or an aryl group and $R^6$ represents hydrogen or hydrocarbyl.

5. The method of claim 3 wherein X is —CN and Y is —$COOR^7$ wherein $R^7$ is a $C_1$–$C_5$ alkyl or $C_2$–$C_5$ alkenyl group.

6. The method of claim 3 wherein the polymerizable resist monomer is ethyl 2-cyanopenta-2,4-dienoate.

7. The method of claim 3 wherein the polymerizable resist monomer is allyl cyanopenta-2,4-dienoate.

8. The method of claim 3 wherein the polymerizable resist monomer is applied to the substrate by way of vapor deposition.

9. The method of claim 8 wherein the substrate to be coated is one having a surface reactive to activate polymerization of the polymerizable resist monomer and is first treated with a photo-sensitive compound which releases an acid when exposed to actinic or ionizing radiation and then is image-wise exposed to radiation of an effective energy for releasing said acid from said photosensitive compound, before exposing the substrate to the monomer vapor.

10. The method of claim 8 wherein the substrate, after vapor deposition of the polymerization resist monomer is image-wise exposed to high energy radiation and thereafter subjected to a solvent development process to form a negative tone image.

11. The method of claim 3 wherein the polymerizable resist monomer is applied by spin coating.

* * * * *

UNITED STATES PATENT AND TRADEMARK OFFICE
CERTIFICATE OF CORRECTION

PATENT NO. : 5,187,048
DATED : February 16, 1993
INVENTOR(S) : Woods et al

It is certified that error appears in the above-indentified patent and that said Letters Patent is hereby corrected as shown below:

Col. 1, line 5, before the first sentence, insert -- This application is a division of Ser. No. 07/542,465, filed 22 June 1990, now abandoned. --

Signed and Sealed this

Twenty-eighth Day of December, 1993

Attest:

BRUCE LEHMAN

Attesting Officer          Commissioner of Patents and Trademarks